United States Patent
Boerner

(10) Patent No.: US 9,425,425 B2
(45) Date of Patent: Aug. 23, 2016

(54) STRENGTHENED COUNTER ELECTRODE OF ELECTROLUMINESCENT DEVICES

(75) Inventor: Herbert F. Boerner, Aachen (DE)

(73) Assignee: Koninklijke Philips N.V., Eindhoven (NL)

(*) Notice: Subject to any disclaimer, the term of this patent is extended or adjusted under 35 U.S.C. 154(b) by 237 days.

(21) Appl. No.: 13/509,929

(22) PCT Filed: Nov. 19, 2010

(86) PCT No.: PCT/IB2010/055294
§ 371 (c)(1),
(2), (4) Date: May 15, 2012

(87) PCT Pub. No.: WO2011/064700
PCT Pub. Date: Jun. 3, 2011

(65) Prior Publication Data
US 2012/0228667 A1    Sep. 13, 2012

(30) Foreign Application Priority Data
Nov. 27, 2009   (EP) .................................. 09177352

(51) Int. Cl.
*H01L 51/50* (2006.01)
*H01L 51/52* (2006.01)

(52) U.S. Cl.
CPC ............ *H01L 51/5221* (2013.01); *H01L 51/50* (2013.01); *H01L 51/5243* (2013.01); *H01L 51/5092* (2013.01)

(58) Field of Classification Search
CPC ............... H01L 51/50; H01L 51/5243; H01L 51/5221; H01L 51/5092

USPC ...................................... 257/99, 43, E33.066
See application file for complete search history.

(56) References Cited

U.S. PATENT DOCUMENTS

| | | | |
|---|---|---|---|
| 6,693,352 B1* | 2/2004 | Huang | H01L 29/452 257/743 |
| 6,872,114 B2 | 3/2005 | Chung et al. | |
| 2006/0035015 A1* | 2/2006 | Raychaudhuri et al. | 427/66 |
| 2006/0088951 A1 | 4/2006 | Hayashi et al. | |
| 2007/0164673 A1 | 7/2007 | Hu | |
| 2007/0241665 A1 | 10/2007 | Sakanoue et al. | |
| 2007/0278950 A1 | 12/2007 | Hu et al. | |
| 2008/0100202 A1 | 5/2008 | Cok | |
| 2008/0231180 A1* | 9/2008 | Waffenschmidt et al. | 313/506 |
| 2008/0305360 A1 | 12/2008 | Han et al. | |
| 2009/0302755 A1* | 12/2009 | Racine et al. | 313/505 |

FOREIGN PATENT DOCUMENTS

| | | |
|---|---|---|
| EP | 1521316 A2 | 4/2005 |
| EP | 2048722 A1 | 4/2009 |
| JP | 11149985 A | 6/1999 |

(Continued)

*Primary Examiner* — Asok K Sarkar
*Assistant Examiner* — Dmitriy Yemelyanov

(57) ABSTRACT

The present invention provides an electroluminescent device comprising a substrate (1) and stacked thereon in the order of mention a first transparent electrode (2), an electroluminescent stack (3), and a second electrode (4). Furthermore, the electroluminescent device comprises at least one additional hard layer (5) that is located underneath the second electrode and/or on top of the second electrode and that has a hardness larger than the hardness of the second electrode. Methods for the production of such electroluminescent devices are likewise provided.

14 Claims, 1 Drawing Sheet

(56) References Cited

FOREIGN PATENT DOCUMENTS

| JP | 200152858 A | 2/2001 |
| JP | 2002367784 | 12/2002 |
| JP | 200317245 A | 1/2003 |
| JP | 2003303687 A | 10/2003 |
| JP | 2005222733 | 2/2004 |
| JP | 2006210233 A | 8/2006 |
| JP | 2007095518 A | 4/2007 |
| WO | 0115244 A1 | 3/2001 |

* cited by examiner

STRENGTHENED COUNTER ELECTRODE OF ELECTROLUMINESCENT DEVICES

FIELD OF THE INVENTION

The invention relates to the field of electroluminescent devices, such as OLED devices, wherein the counter electrode is strengthened by at least one additional layer with a hardness larger than that of the counter electrode.

BACKGROUND OF THE INVENTION

Conventional electroluminescent (EL) devices are usually produced by deposition of the electrodes and the required thin electroluminescent layer(s) on a transparent substrate such as glass or a polymer foil through which the light is emitted. When a voltage between around 2 and 10 Volts is applied between the two electrodes the electroluminescent layer or stack of layers emits light.

In such EL devices the electrode deposited onto the substrate—usually referred to as substrate electrode and also usually forming the anode—can be deposited as thin layer of an electrically conducting but optically transparent oxide, usually indium-tin oxide (ITO). The electrode opposing the substrate electrode—usually referred to as counter electrode and also usually forming the cathode—is generally formed by evaporation of a layer of aluminum or silver with a thickness of around 100 nm after deposition of the electroluminescent layer(s).

In another type of EL device, the non-transparent aluminum electrode is replaced by a semitransparent, thin silver electrode. In this case, transparent EL devices with a transparency of about ⅔, i.e. about 66%, can be produced. These EL devices emit light both from the front, i.e. through the substrate, as well as from the back, i.e. through the silver electrode.

Both types of counter electrodes are extremely sensitive, so they cannot be touched by a wire etc, e.g. in order to electrically contact the device, without scratching and thus damaging the EL device. This sensitivity of the counter electrode is due to the soft metals used as conductor and/or a light reflector. These properties of the counter electrode especially lead to the following disadvantageous consequences:

Contacting the counter electrode by conductive glue requires either special glues or protective isolating layers between both electrodes, otherwise shorts will develop.

When a cover lid that is often used with such EL devices touches the counter electrode even slightly, shorts will develop.

When getter material touches the counter electrode, shorts will develop.

SUMMARY OF THE INVENTION

It is an object of the invention to provide an EL device with a strengthened and thus less sensitive counter electrode. A further object of the invention is the provision of a method for the production of such an EL device.

This object is achieved by an EL device and the method according to the appended independent claims. In particular, an EL device is provided comprising a substrate and stacked thereon in the order of mention: a first transparent electrode, an electroluminescent stack and a second electrode, wherein the EL device further comprises at least one additional hard layer that is a) located underneath the second electrode and/or on top of the second electrode, and that b) has a hardness larger than the hardness of the second electrode. By means of such at least one additional hard layer the second electrode, i.e. the counter electrode, is advantageously strengthened, resulting in a less sensitive counter electrode.

Furthermore, the additional hard layer(s) allow(s) for an assembly of the EL device wherein shorts are prevented. Particularly, it becomes possible to contact the counter electrode using practically any conductive glue available. Even such glues can be used that would require additional protective isolating layers between both electrodes with conventional EL devices. In addition, the additional hard layer(s) prevent(s) damage to the counter electrode when it is touched by cover lids and/or getter material. Furthermore, due to the less sensitive counter electrode it is now possible to contact the EL device with a probe to check for proper operation. This is extremely advantageous during the production of the EL device in order to select and single out dysfunctional EL devices or such of poor quality.

The EL device can be any EL device known to the skilled person and/or any device for the generation of light based on electroluminescent diodes. Preferably the EL device is an organic EL device, i.e. an OLED device. In further embodiments the EL device of the present invention is used as or comprised by a light source, a lamp, or is comprised by a monitor, switch or display. Thus, also a light source, a lamp, a monitor, a switch and a display comprising the inventive EL device are encompassed by the present invention.

In the following the basic structure of an organic EL device is described comprising a substrate and stacked thereon a first transparent electrode, an organic electroluminescent stack, and a second electrode. However, various other basic structures of EL devices, and particularly organic EL devices, are known to the skilled person, all of which are meant to be encompassed by the present invention.

An exemplary basic EL device comprises two electrodes, i.e. an anode and a cathode, wherein the anode is usually disposed on a substrate such as glass or flexible polyethylene terephtalate (PET) foil. On top of the transparent substrate electrode, the EL stack is disposed comprising at least one emitter layer comprising at least one type of EL molecules. A second electrode, i.e. the cathode acting as the counter electrode, is disposed on top of said electroluminescent stack. The skilled person will be aware of the fact that various other layers may be incorporated for the production of such an EL device, for example, a hole transport layer that may contact the anode, an electron transport layer that may contact the cathode, a hole injection layer—preferably made from poly(3,4-ethylendioxythiophene)/polystyrolsulfonate (PEDOT/PSS)—disposed between the anode and the hole transport layer and/or a electron injection layer—preferably a very thin layer made from lithium fluoride, or cesium fluoride—disposed between the electron transport layer and the cathode. Furthermore, it is known to the skilled person that EL devices may comprise an EL stack wherein more than one emitter layer is present.

In one embodiment the EL device is an OLED device, i.e. the electroluminescent emission layer(s) comprise organic molecules. In further preferred embodiments the organic molecules comprise polymers (PLEDs) or small molecules (SMOLEDs). In another preferred embodiment, the EL device is a phosphorescent organic light-emitting diode (PHOLED) device. The present invention is not restricted to specific organic molecules provided such are suitable for the use as electroluminescent molecules in EL devices. Various electroluminescent and/or organic electroluminescent molecules are known to the skilled person, all of which are meant to be encompassed by the present invention. As used in the present invention "electroluminescent molecules" preferably mean "organic electroluminescent molecules". In preferred embodiments the polymers of a PLED are conjugated polymers such as derivates of poly(p-phenylen-vinyls) (PPV) and the small molecules of an SMOLED are organo-metallic chelates, such as for example Alq3, and/or conjugated dendrimers.

The substrate preferably is transparent and can comprise any suitable material known to the skilled person. In the present invention the term "transparent" refers to the transmission of in the visible range of ≥50% light in the given material, e.g. the substrate or the electrode. The remaining light is thus either reflected and/or absorbed. "Transparent" includes "semi-transparent" referring to a material that exhibits a transmission of light in the visible range of between ≥10% and <50%. Thus, whenever reference is made to a "transparent" material this also explicitly discloses a "semi-transparent" material if not stated otherwise. Preferably light in the visible range has a wavelength of between ≥450 nm and ≤700 nm. Thus, for example, a transparent substrate or electrode absorbs and/or reflects less than 50% of the incident light.

In preferred embodiments of the invention the substrate is made from glass, plastics, ceramics, and/or comprises at least one of gold and silver. Further preferred materials for the substrate comprise polymer sheets or foils, more preferably with a suitable moisture and oxygen barrier to essentially prevent moisture and/or oxygen entering the EL device. The substrate may further comprise additional layers, e.g. for optical purposes such as light out-coupling enhancement and the like.

The substrate can have any suitable geometry, shape or form but is preferably flat and may, if a flexible material is utilized, be shaped or bent into any three-dimensional shape that is required.

The electrodes can be made from any suitable material known to the skilled person.

In a preferred embodiment the first electrode, i.e. the substrate electrode, is a transparent electrode. In a further preferred embodiment of the invention the substrate electrode comprises a transparent conducting oxide (TCO), more preferably indium-tin oxide (ITO), ZnO, or doped ZnO. Optionally the substrate electrode is undercoated with $SiO_2$ and/or SiO to advantageously suppress diffusion of mobile atoms or ions from the substrate into the electrode. Electrodes comprising a TCO preferably have a transparency of ≥60% and ≤100%, more preferably of ≥70% and ≤90% and most preferably of about 80%.

In further embodiments of the invention the second electrode, i.e. the counter electrode, is a non-transparent Al electrode or a transparent Ag or Au electrode. Preferably, such thin-film electrodes have a thickness of about 100 nm in the case of Al and of ≥3 nm and ≤20 nm, more preferably of ≥5 nm and ≤15 nm and most preferably of about ≥8 and ≤10 nm in the case of Ag or Au.

Transparent electrodes comprising a thin metal layer, such as an Ag or Au layer, preferably have a transparency of ≥50% and ≤100%, more preferably of ≥60% and ≤80% and most preferably of about 66%.

In a further preferred embodiment the first transparent electrode disposed onto the substrate, i.e. the front or substrate electrode, is the anode and the second transparent electrode disposed onto the EL stack, i.e. the counter or back electrode, is the cathode.

The electrodes can be connected to a voltage/current source via electrical conductors.

The EL stack can be any EL stack known to the skilled person and/or suitable for an EL device. As described above an EL stack comprises at least one EL emitter layer comprising EL molecules. A single EL emitter layer preferably has a thickness of about 10 nm.

Preferred EL stacks comprise more than one EL layer, each comprising at least one type of EL molecule. Preferably, the EL layers emit light of different colors. This is especially advantageous if color tuneable EL devices are required. In a further embodiment of the invention the EL stack comprises at least two EL emission layers having different emission colors. This means that if the EL device of the present invention is induced to emit light by application of electric voltage/current each of the at least two emission layers will emit light at a different wavelength.

Different emission colors are usually achieved by use of different EL molecules that are comprised by the EL emission layers. Each EL emission layer can comprise a single or, more than one type of EL molecules. In more preferred embodiments, the EL stack comprises three EL emission layers emitting red, green and blue light, respectively.

The EL device of the present invention further comprises at least one additional hard layer that is located underneath the second electrode and/or on top of the second electrode. Such an additional hard layer has the advantage that the counter electrode is strengthened which results in a less sensitive counter electrode. Additionally, the EL device can be assembled more readily and without generation of shorts: Advantageously, it becomes possible to contact the counter electrode using a multitude of conductive glues that required additional protective isolating layers between both electrodes with conventional EL devices. As further advantages, the additional hard layer prevents cover lids and/or getter material from touching the counter electrode.

The hard layer can be located underneath the second electrode, i.e. closer to the first electrode than the second electrode and/or on top of the second electrode, i.e. above the second electrode, thus facing away from the first electrode and being positioned further away from the first electrode than the second electrode.

In a preferred embodiment the hard layer is directly located underneath and/or on top of the second electrode, i.e. a face of the additional hard layer physically contacts a face of the second electrode.

In a more preferred embodiment two additional hard layers are present, wherein a first hard layer is located underneath the second electrode and a second hard layer is located on top of the second electrode. Further hard layers may be present.

In a further embodiment of the invention the thickness of the at least one additional hard layer is ≥5 nm and ≤10 µm, preferably ≥10 nm and ≤10 µm, even more preferably ≥20 nm and ≤1 µm.

The at least one additional layer of the EL device of the present invention has a hardness that is larger than the hardness of the second electrode. The term "hardness" as used in the present invention refers to the resistance of a solid material to permanent deformation. Hardness can be measured on the Mohs scale or various other scales, such as the Rockwell, Vickers, and Brinell scales. Such methods for the measurement of the hardness of a material are well known to the skilled person.

In another preferred embodiment the hardness of the additional layer is ≥2.75, which is the hardness of Aluminium and ≤10, preferably ≥3 and ≤9, or more preferably ≥3 and ≤7 on the Mohs scale.

The required thickness and the required hardness of the protective layer(s) depend on the type of conductive glue used. Usually, these glues are non-conductive when employed. During hardening, the polymeric matrix shrinks and presses the conductive particles onto each other in also into intimate contact with the layers to be joined. This shrinkage leads to a formation of percolation paths between the conductive particles and the conductive surfaces to be connected. The thickness and hardness of the protective layer depend now on the shrinkage properties of the glue and on the hardness of the conducting particles. In practice, it is easiest to make a thickness series to test which thickness is required for certain conductive glue. With the conductive epoxy CW2400 from Circuit works, a copper layer of about 300 to 400 nm was sufficient to prevent damage to the OLED device.

The skilled person is aware of a multitude of materials that can be used in order to produce the additional hard layer according to the invention. Preferable such materials can be deposited by vapor deposition techniques, more preferably by physical or chemical vapor deposition techniques. In further preferred embodiments the material is suitable to be deposited by thermal evaporation, thermal evaporation in vacuum, evaporation by electron-beam evaporation or sputtering.

In a preferred embodiment of the invention the material used for a hard layer that is located on top of the second electrode is a chemically inert material. This has the advantages that a large selection of conductive glues which otherwise would destroy the second electrode can be used and that getter particles of getter material is kept from coming in contact with the second electrode. Especially preferred examples for chemically inert materials that may be used for the additional hard layer are fluorides and/or oxides.

In further embodiments the material used for a hard layer is an electrically conducting or non-conducting material, i.e. an insulator.

In preferred embodiments of the invention the additional hard layer comprises semiconducting metal oxides, such as $MoO_3$, $WO_3$, $V_2O_2$; hard metals or metal alloys such as copper, manganese, chromium, iron, or refractory metals like molybdenum or tungsten; oxides like SiO, $SiO_2$, $TiO_2$; nitrides such as SiN; or fluorides such as $CaF_2$ or MgF. If a non-conductive layer is used for an additional hard layer positioned on top of the second electrode, a covering layer comprising a conductive metal that connects to the underlying second electrode can be used.

In a particularly preferred embodiment of the invention the at least one additional hard layer is located underneath the second electrode and consists of a layer comprising at least one semiconducting metal oxide. Surprisingly, such oxides are much harder than the metals of the second electrode. More preferably, this semiconducting metal oxide is selected from the group consisting of $MoO_3$, $WO_3$ and $V_2O_3$. Such an arrangement of the additional hard layer has the advantage that the oxide(s) serve as charge injector(s) for the organic layers. Thus, the hard layer of this embodiment preferably is in direct contact with the organic layer. The hard layer of this embodiment may cover a part of the second electrode or the complete second electrode. Preferably, it covers the full area of the second electrode.

In another particularly preferred embodiment of the invention the at least one additional hard layer is located on top of the second electrode and consists of an electrically conductive layer comprising a hard metal, metal alloy and/or a conductive oxide. Preferably, the hard metal or metal alloy comprises at least one metal selected from the group consisting of Cu, Mn, Cr, Fe, refractory metals, Mb and W. The conductive oxide preferably is $WO_3$. The hard layer of this embodiment may cover a part of the second electrode or the complete second electrode; preferably, it covers the full area of the second electrode. Thus, the hard layer of this embodiment advantageously covers and protects the sensitive second electrode and at the same time provides a means to electrically contact the second electrode. In an especially preferred embodiment the hard metal is applied to the cathode with a thickness of ≥200 and ≤500 nm, more preferably ≥300 and ≤400 nm. Even more preferably, such a hard metal layer comprises copper.

In a further particularly preferred embodiment of the invention the at least one additional hard layer is located on top of the second electrode and consists of an electrically non-conductive, i.e. insulating, layer comprising at least one a material selected from the group consisting of oxides, nitrides and fluorides. Especially preferred oxides according to the invention are SiO, $SiO_2$, or $TiO_2$; an especially preferred nitride according to the invention is SiN; especially preferred fluorides of the invention are $CaF_2$ and MgF. The hard layer of this embodiment may cover a part of the second electrode or the complete second electrode. Preferably, it covers less than the full area of the second electrode to allow an encapsulation of the hard insulating layer by a further conductive layer, e.g. a metal layer, that contacts the second electrode. Thus, most preferably the hard layer covers the second electrode in a central position and is surrounded by a rim-like area not covering the second electrode. The uncovered, rim-like area is then used to contact the second electrode via the further conductive layer. Advantageously, if the rim-like area is as small as possible and located in the outermost perimeter of the second electrode, the contacting further conductive layer protects the complete second electrode from getter material that may be present in the EL device.

Thus, in a further preferred embodiment the EL device further comprises a further conductive layer located on top of the hard layer that electrically contacts the second electrode.

In especially preferred embodiments of the invention the EL device comprises more than one additional hard layer, i.e. a combination of one or more hard layers as described above. More preferably, the EL device comprises at least one hard layer that is located underneath the second electrode as described above and at least one further hard layer that is located on top of the second electrode as described above—possibly with an additional encapsulating conductive layer. Thus, advantageously the charge injection effect of the hard layer located underneath the second electrode is combined with the protective effect of the hard layer located on top of the second electrode.

In another embodiment of the invention the EL device further comprises cover means to—preferably hermetically—seal the EL device and protect it from environmental influences such as moisture and/or gas, such as oxygen. A wide selection of cover means are known to the skilled person and particularly comprise cover lids or cavity lids. The cover means is advantageously used to electrically contact the second electrode directly or indirectly and may itself be electrically conductive and/or provide contacting means such as feed-troughs.

The EL device of the invention may further comprise at least one contacting means arranged to electrically contact the covering means to the second electrode. This contacting can be carried out directly or indirectly. Various contacting means are known to the skilled, all of which are meant to be encompassed by the present invention. Particularly preferred contacting means comprise conductive glue and/or mechanical contacting means.

Conductive glue can be used to electrically contact the EL device. A multitude of suitable conductive glues are known to the skilled person all of which are encompassed by the present invention. Advantageously, if the second electrode is protected by an additional hard layer that is located on top of the second electrode then a wide selection of conductive glues which otherwise would destroy the second electrode can be used. An especially preferred glue that can be used is for example "Circuitworks conductive glue CW2400", a two-component epoxy a filling of silver particles. An advantage of this glue is that it is very inexpensive.

In another embodiment of the invention the EL device comprises a mechanical contacting means to electrically contact the second electrode directly or indirectly. Such mechanical contacting means comprise conductive spring, posts and/or spacers, preferably soft posts or spacers.

Preferably, the cover means encapsulates the EL device and is electrically contacted on the outside. The at least one contacting means is connected to the inside of the cover means and touches the second electrode, hard layer located thereon, or additional conductive layer encapsulating the hard layer. Thereby, the EL device is electrically contacted.

The term "directly contacting" as used herein, describes a direct physical connection between the parts in question. The term "indirectly contacting" as used herein describes an indirect connection between the parts in question. For example, if a hard layer according to the invention is located on top of the second electrode then a spring used as a contacting means that touches said hard layer indirectly contacts the second electrode electrically, while it directly contacts the hard layer electrically.

The electroluminescent device according to the invention may further comprise a getter material. As known to the skilled person, getter materials are reactive materials used for removing traces of gas and are used to fill the cavity generated by the cover means. Preferred getter materials comprise CaO, and/or zeolites. As a contacting of the getter material with the second electrode is to be prevented the hard layer according to the invention covering the second electrode advantageously protects the sensitive electrode.

In another aspect, the invention is directed to a method of producing the EL device according to the invention and comprises the steps of: a) providing a substrate; and b) depositing onto the substrate in the order of mention: a first transparent electrode, an electroluminescent stack, and a second electrode, wherein at least one additional hard layer is further deposited before and/or after the deposition of the second electrode, and wherein the additional hard layer has a hardness larger than the hardness of the second electrode.

The deposition steps can be carried out by any suitable means. A group of preferred deposition techniques widely known to the skilled person are the vapor deposition techniques. Such techniques comprise chemical vapor deposition (CVD), such as low pressure CVD (LPCVD) or physical vapor deposition (PVD), such as sputtering or electron-beam evaporation.

The materials used to produce the additional hard layer located underneath the second electrode are preferably deposited by thermal evaporation in vacuum.

The materials used to produce the additional hard layer located on top of the second electrode are preferably deposited by thermal evaporation, by electron-beam evaporation or by sputtering.

Preferred embodiments of the method according to the invention will be readily apparent to the skilled person when reading the description regarding the EL device above. However, in the following some of the preferred embodiments will explicitly be disclosed.

In one embodiment the deposition of the at least one hard layer is carried out in a way that the hard layer is located directly underneath and/or on top of the second electrode. The deposition of the hard layer can also be carried out so that the hard layer is in contact with the electroluminescent stack.

The deposition of the at least one hard layer can further be carried out so that the hard layer covers the second electrode partially or completely.

As explained above, the required thickness and hardness of the layer depends on the type of glue employed. For the Circuitworks conductive glue, 300-400 nm of copper were required to prevent damage to the OLED device. The skilled person is aware of the possibility to carry out thickness series in order to readily determine the required thickness experimentally.

In another embodiment of the invention at least one semiconducting metal oxide, preferably selected from the group consisting of $MoO_3$, $WO_3$ and $V_2O_3$, is deposited in order to form a hard layer located underneath the second electrode.

In a further embodiment of the invention a conductive layer is deposited as a hard layer located on top of the second electrode. Preferably, at least one material selected from a hard metal, a metal alloy, and/or a conductive oxide is deposited to produce said layer.

In an additional embodiment of the invention a non-conductive layer, i.e. an insulating layer, is deposited as a hard layer located on top of the second electrode. Preferably at least one material selected from the group consisting of oxides, nitrides and fluorides is deposited in order to produce said layer. More preferably, if such a non-conductive hard layer is deposited on top of the second electrode, a further conductive layer is deposited on top of the hard layer that electrically contacts the second electrode.

In specifically preferred embodiments of the invention at least two hard layers are deposited, wherein at least one hard layer is deposited before the deposition of second electrode and at least one hard layer is deposited after the deposition of the second electrode.

In another embodiment of the invention the method further comprises the step of temporarily contacting the EL device with a probe to check for proper operation of the device. Preferably, the protecting hard layer on top of the second electrode is contacted by the probe, i.e. the contacting is carried out after deposition of this hard layer. This has the advantage that during the production of the EL device dysfunctional EL devices or EL devices of poor quality can be detected and singled out.

In even another embodiment of the invention the method further comprises applying a cover means, at least one contacting means and/or a getter material to the EL device.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
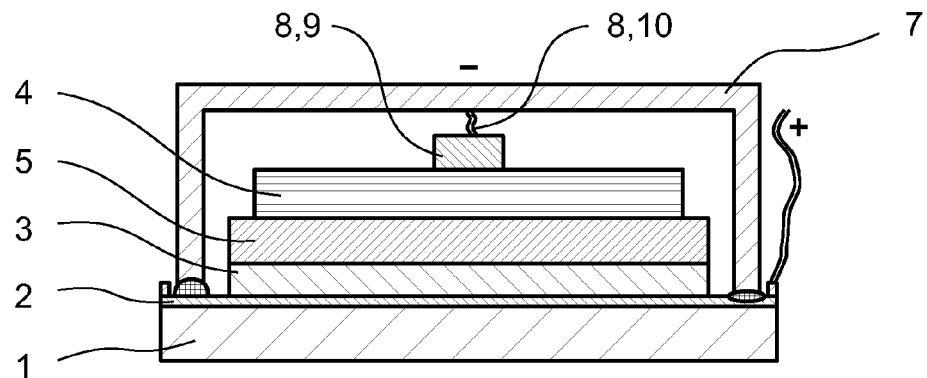
FIG. 1 shows a schematic cross-sectional view of an EL device according to the present invention.

FIG. 1 is a schematic cross-sectional view of an EL device according to the present invention. The EL device depicted is an OLED device and comprises a flat glass substrate 1 onto which a transparent ITO anode 2 has been deposited by CVD. On top of the electrode an OLED stack 3 and an Al cathode 4 have been deposited. The cathode has a thickness of about 100 nm. The OLED device has been encapsulated by a cavity lid serving as cover means 7 to hermetically seal the device.

As can be further taken from FIG. 1, the OLED device is electrically contacted via the cavity lid and the cathode, respectively. The cavity lid is made from a conductive material, i.e. a metal, and electrically contacts the cathode indirectly via two contacting means 8, i.e. conductive glue 9 that has been directly applied to the cathode and a conductive spring 10 that touches both cavity lid and conductive glue.

A single hard layer 5 comprising $MoO_3$, with a thickness of about 100 nm and has been deposited directly underneath the cathode by thermal evaporation of the material in vacuum and completely covers the lower face of the cathode. The hard layer is in contact with the cathode. Furthermore, the hard layer contacts the OLED stack and thus provides for a charge injection into the electroluminescent stack.

Figure 2:
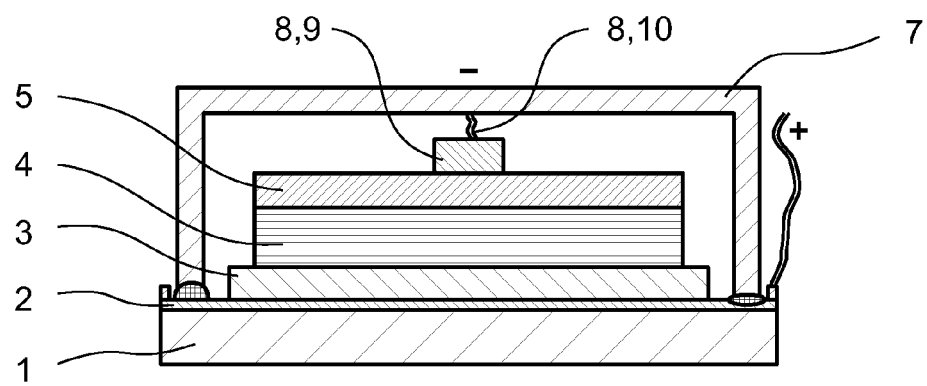
FIG. 2 shows a schematic cross-sectional view of another embodiment of the EL device according to the present invention.

FIG. 2 is a schematic cross-sectional view of another embodiment of the EL device according to the present invention. Again, the depicted EL device is an OLED device that comprises a flat glass substrate 1 onto which a transparent ITO anode 2 has been deposited by CVD. On top of this first electrode an electroluminescent stack 3 and an Ag cathode 4 have been deposited. The cathode has a thickness of about 100 nm. The OLED device has been encapsulated by a cavity lid serving as cover means 7 to hermetically seal the device.

Also the OLED device of FIG. 2 is electrically contacted via the cavity lid and the cathode, respectively. The cavity lid is made from a conductive material, i.e. a metal, and electrically contacts the cathode indirectly via two contacting means 8 and hard layer 5. The contacting means are conductive glue 9 that has been directly applied to the single conductive hard layer and a conductive post 10 that touches both cavity lid and conductive glue.

The single conductive hard layer 5 comprises $WO_3$ and has a thickness of about 100 nm. It has been deposited directly on top of the cathode by electron-beam or thermal evaporation completely covering the upper face of the cathode. The hard layer is in contact with the cathode and protectively covers the sensitive electrode.

Furthermore, a getter material (not shown) is present in the cavity created by the cavity lid.

Figure 3:
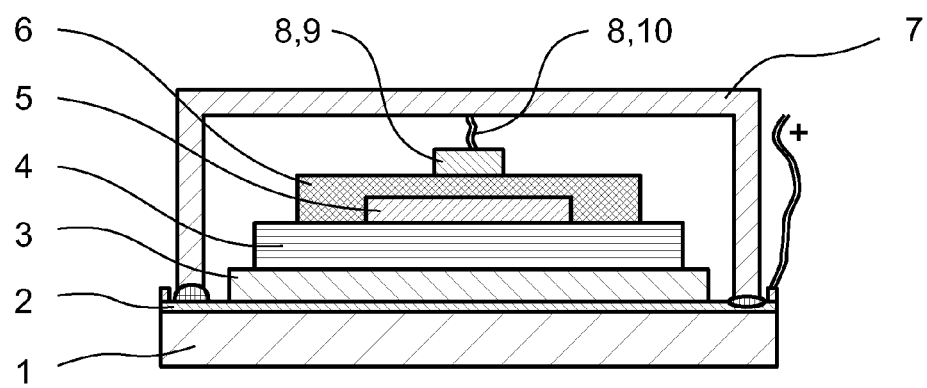
FIG. 3 shows a schematic cross-sectional view of even a further embodiment of the EL device according to the present invention.

FIG. 3 is a schematic cross-sectional view of even a further embodiment of the EL device according to the present invention. As with FIG. 1 or 2, the depicted EL device is an OLED device that comprises a flat glass substrate 1 onto which a transparent ITO anode 2 has been deposited by CVD. On top of this first electrode an electroluminescent stack 3 and an Ag cathode 4 have been deposited. The cathode has a thickness of about 100 nm. The OLED device has been encapsulated by a cavity lid serving as cover means 7 to hermetically seal the device.

Also the OLED device of FIG. 3 is electrically contacted via the cavity lid and the cathode, respectively. The cavity lid is made from metal and electrically contacts the anode indirectly via two contacting means 8 and an additional conductive metal layer 6. The contacting means are conductive glue 9 that has been directly applied to the additional conductive layer 6 and a conductive spacer 10 that touches both cavity lid and conductive glue.

The single non-conductive hard layer 5 comprises $SiO_2$ and has a thickness of about 100 nm and a. It has been deposited directly on top of the cathode by sputtering and only partially covers the cathode. The hard layer is in contact with the cathode and protectively covers this sensitive electrode, while the encapsulating additional conductive metal layer 6 contacts the cathode in the places that are not covered by the non-conductive hard layer, thus providing for an electrical connection.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An electroluminescent device comprising:
    a substrate, and stacked thereon in the order of mention,
        a first transparent electrode, an electroluminescent stack, and a second electrode;
    at least one hard layer that is located directly on top of the second electrode; and an encapsulating conductive layer that directly contacts the second electrode in places that are not covered by the hard layer, wherein at least a portion of the second electrode is not overlaid with said encapsulating conductive layer;
    a cover; and
    a contact that provides an electrical connection directly between the cover and the encapsulating conductive layer, the contact comprising:
        a conductive glue that is in direct contact with the encapsulating conductive layer; and
        a conductive spacer that it is in direct contact with the conductive glue and the cover
    wherein the hard layer has a hardness larger than the hardness of the second electrode.

2. The electroluminescent device according to claim 1, wherein the thickness of the at least one hard layer is ≥5 nm and ≤50 μm.

3. The electroluminescent device according to claim 1, wherein the at least one hard layer, is a conductive layer and comprises a hard metal, a metal alloy, and/or a conductive oxide.

4. The electroluminescent device according to claim 1, wherein the at least one hard layer is a non-conductive layer and comprises at least one material selected from the group consisting of oxides, nitrides and fluorides.

5. The electroluminescent device according to claim 1, wherein the contact comprises at least one of a conductive glue, a mechanical contacting means, a conductive spring, a conductive post or a conductive spacer.

6. The electroluminescent device according to claim 1, further comprising a getter material.

7. The electroluminescent device according to claim 1, wherein the encapsulating conductive layer encapsulates the hard layer.

8. The electroluminescent device according to claim 1, further comprising:
 a contact directly connected to a top surface of said encapsulating conductive layer, wherein the area of direct connection between the contact and the encapsulating conductive layer is substantially smaller than the area of a top surface of the second electrode.

9. The electroluminescent device according to claim 1, wherein the area of direct contact between the encapsulating conductive layer and the second electrode is smaller than the area of direct contact between the at least one hard layer and the second electrode.

10. The electroluminescent device according to claim 1, wherein the contact provides an electrical connection between the cover and the at least one hard layer.

11. The electroluminescent device according to claim 1, wherein the at least one hard layer is comprised of a semiconducting metal oxide.

12. The electroluminescent device according to claim 11, wherein the semiconducting metal oxide is selected from the group consisting of $MoO_3$, $WO_3$, $V_2O_2$.

13. An electroluminescent device, comprising:
 a substrate, and stacked thereon in the order of mention, a first transparent electrode, an electroluminescent stack, and a second electrode;
 at least one hard layer that is located directly on top of the second electrode;
 an encapsulating conductive layer that encapsulates the at least one hard layer and that directly contacts the second electrode in places that are not covered by the hard layer;
 a cover; and
 at least one contacting means comprising:
  a conductive glue that is applied directly to the encapsulating conductive layer; and
  a conductive spacer that directly contacts the conductive glue and the cover means,
 wherein the additional hard layer has a hardness larger than the hardness of the second electrode.

14. An electroluminescent device comprising:
 a substrate, and stacked thereon in the order of mention, a first transparent electrode, an electroluminescent stack, and a second electrode;
 at least one hard layer that is located directly on top of the second electrode; and an encapsulating conductive layer that directly contacts the second electrode in places that are not covered by the hard layer, and
 a contact directly connected to a top surface of said encapsulating conductive layer, wherein the area of direct connection between the contact and the encapsulating conductive layer is substantially smaller than the area of a top surface of the second electrode;
 wherein at least a portion of the second electrode is not overlaid with said encapsulating conductive layer,
 wherein the hard layer has a hardness larger than the hardness of the second electrode
 wherein the at least a portion said encapsulating conductive layer at least partially surrounds said second electrode.

* * * * *